(12) United States Patent
Kumar et al.

(10) Patent No.: US 12,731,961 B2
(45) Date of Patent: Sep. 8, 2026

(54) TECHNOLOGIES FOR A PHASE-LOCKED TERAHERTZ PLASMONIC LASER ARRAY WITH MICROCAVITIES

(71) Applicant: Lehigh University, Bethlehem, PA (US)

(72) Inventors: Sushil Kumar, Center Valley, PA (US); Yuan Jin, Bethlehem, PA (US)

(73) Assignee: Lehigh University

( * ) Notice: Subject to any disclaimer, the term of this patent is extended or adjusted under 35 U.S.C. 154(b) by 951 days.

(21) Appl. No.: 17/740,407

(22) Filed: May 10, 2022

(65) Prior Publication Data

US 2022/0360045 A1 Nov. 10, 2022

Related U.S. Application Data

(60) Provisional application No. 63/186,233, filed on May 10, 2021.

(51) Int. Cl.

*H01S 5/10* (2021.01)
*H01S 5/062* (2006.01)
*H01S 5/34* (2006.01)

(52) U.S. Cl.

CPC ........ *H01S 5/1042* (2013.01); *H01S 5/06246* (2013.01); *H01S 5/1046* (2013.01); *H01S 5/3402* (2013.01)

(58) Field of Classification Search

CPC .... H01S 5/3401; H01S 5/3402; H01S 5/1046; H01S 5/1042

See application file for complete search history.

(56) References Cited

U.S. PATENT DOCUMENTS 6,194,240 B1 * 2/2001 Chiu .......................... H01S 5/12 438/31
7,272,158 B1 * 9/2007 Hayes ...................... G02F 1/365 372/4

(Continued)

FOREIGN PATENT DOCUMENTS

| | | | | |
|---|---|---|---|---|
| CN | 103197365 B * | 8/2015 | | |
| DE | 102008003182 A1 * | 7/2009 | ............. | H10H 20/84 |
| WO | WO-2020055499 A2 * | 3/2020 | ........... | H01S 5/3402 |

OTHER PUBLICATIONS

Jin et al., "High Power Edge-cum-Surface Emitting Terahertz Laser Arrays Phased Locked by Vacuum Guided Plasmon Waves", Mar. 31, 2020, Appl. Phys. Lett. 116, 131103. (Year: 2020).*

(Continued)

*Primary Examiner* — Joshua King
(74) *Attorney, Agent, or Firm* — The Belles Group, P.C.

(57) ABSTRACT

A plasmonic laser array device may comprise a first microcavity element having a first radiating end facet and a second radiating end facet opposite the first radiating end facet in a longitudinal direction of the device. The device may comprise a second microcavity element having a third radiating end facet and a fourth radiating end facet opposite the third radiating facet in the longitudinal direction. The device may comprise a first microcavity gap configured to separate the first microcavity element and the second microcavity element in the longitudinal direction. The device may comprise a bottom (e.g., metal) layer configured to underly the first microcavity element, the second microcavity element, and the first microcavity gap. The device may comprise an arrangement that places the first microcavity element and the second microcavity element into a phase-locked orientation for a phased-locked operation of the plasmonic laser array device.

20 Claims, 6 Drawing Sheets

(56) References Cited

U.S. PATENT DOCUMENTS

| | | | | |
|---|---|---|---|---|
| 10,386,581 B2 * | 8/2019 | Chen | H01S 5/3013 | |
| 11,616,344 B2 * | 3/2023 | Vico Trivino | H01L 21/30604 | 438/481 |
| 2009/0110021 A1 * | 4/2009 | Conway | H01S 5/185 | 372/102 |
| 2010/0129085 A1 * | 5/2010 | Smolyaninov | B82Y 20/00 | 398/141 |
| 2011/0080931 A1 * | 4/2011 | Tredicucci | B82Y 20/00 | 372/45.01 |
| 2012/0063478 A1 * | 3/2012 | Park | H01S 5/187 | 372/39 |
| 2013/0266034 A1 * | 10/2013 | Yu | H01S 5/12 | 372/27 |
| 2015/0162724 A1 * | 6/2015 | Mawst | H01S 5/3401 | 372/45.012 |
| 2015/0330838 A1 * | 11/2015 | Mazumder | G01J 9/02 | 356/477 |
| 2016/0190768 A1 * | 6/2016 | Kumar | H01S 5/1046 | 372/45.01 |
| 2017/0077667 A1 * | 3/2017 | Williams | H01S 5/02407 | |
| 2017/0082842 A1 * | 3/2017 | Shaltout | H01S 5/1042 | |
| 2020/0067281 A1 * | 2/2020 | Curwen | H01S 5/3401 | |

OTHER PUBLICATIONS

Kao et al., "Phase-Locked Arrays of Surface-Emitting Terahertz Quantum-Cascade Lasers", Mar. 10, 2010, Appl. Phys. Lett. 96, 101106. (Year: 2010).*

Jin et al., "High Power Edge-cum-Surface Emitting Terahertz Laser Arrays Phased Locked by Vacuum Guided Plasmon Waves [Supplemental material]", Mar. 31, 2020, Appl. Phys. Lett. 116, 131103. (Year: 2020).*

Jin et al., "High-Power Edge-Emitting Terahertz Plasmonic Quantum-Cascade Laser", 2019, CLEO, SW3N.5, 1-2. (Year: 2019).*

John F Federici et al., THz imaging and sensing for security applications-explosives, weapons and drugs, Semiconductor Science and Technology THz., © 2005 IOP Publishing Ltd Printed in the UK, pp. S266-S280.

E Pickwell and V P Wallace Wallace 2006 J. Phys. D: Appl. Phys. 39 R301, Biomedical applications of terahertz technology., Institute of Physics Publishing Journal of Physics D: Applied Physics., © 2006 IOP Publishing Ltd Printed in the UK, pp. R301-R310.

Peter H. Siegel, Fellow, IEEE., Terahertz Technology, IEEE Transactions on Microwave Theory and Techniques, vol. 50, No. 3, Mar. 2002., Downloaded on Apr. 28, 2022., pp. 910-928.

Rudeger Kohler et al., Terahertz semiconductorheterostructure laser., © 2002 Macmillan Magazines Ltd., NATURE | vol. 417 | May 9, 2002 | www.nature.com., pp. 156-159.

Jerome Faist et al., Quantum Cascade Laser., Science., vol. 264., Apr. 22, 1994., pp. 553-556.

Miriam Serena Vitiello et al., Quantum cascade lasers: 20 years of challenges., © 2015 Optical Society of America., published Feb. 20, 2015., vol. 23, No. 4 | DOI: 10.1364/OE.23.005167 | Optics Express., pp. 5167-5182.

Martin Brandstetter et al., High power terahertz quantum cascade lasers with symmetric wafer bonded active regions., Applied Physics Letters 103, 171113 (2013); doi: 10.1063/1.4826943., Published by the AIP Publishing., pp. 171113-1 to 171113-5.

L.H. Li et al., Multi-Watt high-power THz frequency quantum cascade lasers., (School of Electronic and Electrical Engineering, University of Leeds, Leeds LS2 9JT, United Kingdom)., Submitted: Feb. 20, 2017., pp. 1-2.

Carlo Sirtori et al., Wave engineering with THz quantum lasers., nature photonics, Focus | Review Articles., Published Online: Aug. 29, 2013 | vol. 7 | Sep. 2013 | www.nature.com/naturephotonics., pp. 691-701.

Guozhen Liang, et al., Recent Developments of Terahertz Quantum Cascade Lasers., IEEE Journal of Selected Topics in Quantum Electronics, vol. 23, No. 4, Jul./Aug. 2017., pp. 1-18.

Yongquan Zeng et al., Photonic Engineering Technology for the Development of Terahertz Quantum Cascade Lasers., Quantum Cascade Lasers., Advanced Optical Materials., © 2019 WILEY-VCH Verlag Gmbh & Co. KGaA, Weinheim., Adv. Optical Mater. Aug. 2020, 1900573., pp. 1-20.

Gangyi Xu et al., Efficient power extraction in surface-emitting semiconductor lasers using graded photonic heterostructures., nature communications., Published Jul. 17, 2012., © 2012 Macmillan Publishers Limited., pp. 1-10.

Yuan Jin et al., High power surface emitting terahertz laser with hybrid second- and fourth-order Bragg gratings., nature communications., Department of Electrical and Computer Engineering, Lehigh University, Bethlehem, PA 18015, USA., Published online: Apr. 11, 2018., pp. 1-7.

Fang-yuan Zhao et al., Sampled grating terahertz quantum cascade lasers., Applied Physics Letters, 114., Published Online: Apr. 10, 2019., Published under license by AIP Publishing., pp. 141105-1 to 141105-4.

Simone Biasco et al., Highly efficient surface-emitting semiconductor lasers exploiting quasi-crystalline distributed feedback photonic patterns., Biasco et al. Light: Science & Applications (2020)9:54., Official journal of the CIOMP 2047-7538., pp. 1-11.

Christopher A. Curwen et al., Terahertz quantum cascade VECSEL with watt-level output power., Published Online: Jul. 2, 2018., Appl. Phys. Lett. 113., Published by AIP Publishing., pp. 011104-1 to 011104-4.

D. R. Scifres et al., Phase-locked semiconductor laser array., Published Online: Aug. 8, 2008., © 1978 American Institute of Physics., Appl. Phys. Lett. 33, 1015 (1978)., pp. 1015-1017.

J. Katz et al., Diffraction coupled phase-locked semiconductor laser array., Published Online: Jun. 4, 1998., Appl. Phys. Lett. 42, 554 (1983)., © 1983 American Institute of Physics., pp. 554-556.

D. Botez at al., High-power, diffraction-limited-beam operation from phase-locked diode-laser arrays of closely spaced "leaky" waveguides (antiguides)., Published Online: Aug. 4, 1998., Appl. Phys. Lett. 53, 464 (1988)., © 1988 American Institute of Physics., pp. 464-466.

Mohammad P. Hokmabadi et al., Supersymmetric laser arrays., Science 363, 623-626., Feb. 8, 2019., pp. 1-4.

Martin T. Hill et al., Lasing in metal-insulator-metal subwavelength plasmonic waveguides., COBRA Research Institute, Technische Universiteit Eindhoven., published Jun. 18, 2009 / vol. 17, No. 13 / Optics Express 11107., pp. 11107-11112.

Yu-Jung Lu et al., Plasmonic Nanolaser Using Epitaxially Grown Silver Film., Jul. 27, 2012, vol. 337 Science., Science (ISSN 1095-9203) is published by the American Association for the Advancement of Science., Downloaded from https://www.science.org at Lehigh University on Apr. 28, 2022., pp. 450-453.

Rupert F. Oulton, Surface plasmon lasers: sources of nanoscopic light., Jan.-Feb. 2012 | vol. 15 | No. 1-2., materials today., Imperial College London, South Kensington Campus, London SW7 2AZ, UK., ISSN:1369 7021 © Elsevier Ltd 2012., pp. 26-34.

Benjamin S. Williams et al., Terahertz quantum-cascade laser at IÉ100 mm using metal waveguide for mode confinement., Published Online: Sep. 9, 2003., Appl. Phys. Lett. 83, 2124 (2003)., © 2003 American Institute of Physics., pp. 2124-2126.

A. J. L. Adam et al., Beam patterns of terahertz quantum cascade lasers with subwavelength cavity dimensions., Published Online: Apr. 12, 2006., Appl. Phys. Lett. 88, 151105 (2006)., © 2006 American Institute of Physics., pp. 151105-1 to151105-3.

Tsung-Yu Kao et al., Phase-locked laser arrays through global antenna mutual coupling., Nature Photonics., Published Online: Jun. 13, 2016., vol. 10., © 2016 Macmillan Publishers Limited., pp. 541-546.

Ali Khalatpour et al., Phase-locked photonic wire lasers by πcoupling., Nature Photonics., vol. 13., Jan. 2019., pp. 47-53 (www.nature.com/naturephotonics).

Chongzhao Wu et al., Terahertz plasmonic laser radiating in an ultra-narrow beam., vol. 3, No. 7 / Jul. 2016 / Optica., published Jul. 7, 2016., © 2016 Optical Society of America., pp. 734-740.

Wenjia Zhou et al., High-power, continuous-wave, phase-locked quantum cascade laser arrays emitting at 8 μm., vol. 27, No. 11 | May 27, 2019 | Optics Express., pp. 15776-15785.

(56) References Cited

OTHER PUBLICATIONS

P. Lalanne et al., Interaction between optical nano-objects at metallo-dielectric interfaces., Published online: Jul. 23, 2006., nature physics vol. 2 Aug. 2006 www.nature.com/naturephysics., pp. 551-556.
Stephen Kohen et al., Electromagnetic modeling of terahertz quantum cascade laser waveguides and resonators., Published Online: Feb. 14, 2005., Journal of Applied Physics 97, 053106 (2005)., © 2005 American Institute of Physics., pp. 053106-1 to 053106-9.
David Burghoff et al., Gain measurements of scattering-assisted terahertz quantum cascade lasers., Published Online: Jun. 29, 2012., Appl. Phys. Lett. 100, 261111 (2012)., © 2012 American Institute of Physics., pp. 261111-1 to 261111-4.
D. Bachmann et al., Spectral gain profile of a multi-stack terahertz quantum cascade laser., Published Online: Nov. 7, 2014., Appl. Phys. Lett. 105, 181118 (2014)., © 2014 Author(s)., pp. 181118-1 to 181118-5.
Benjamin S. Williams et al., 3.4-THz quantum cascade laser based on longitudinal-optical-phonon scattering for depopulation., Published Online: Feb. 10, 2003., Appl. Phys. Lett. 82, 1015 (2003)., © 2003 American Institute of Physics., pp. 1015-1017.
Sushil Kumar et al., Surface-emitting distributed feedback terahertz quantum-cascade lasers in metal-metal waveguides., Jan. 8, 2007 / vol. 15, No. 1 / Optics Express., © 2007 Optical Society of America., pp. 113-128.
The COMSOL Product Suite., COMSOL Multiphysics., Multiphysics Software for Simulating Real-World Designs, Devices, and Processes., Deployment Products for Simulation Applications., pp. 1-5.
Sushil Kumar., 186 K operation of terahertz quantumcascade lasers based on a diagonal design., Appl. Phys. Lett. 94, 131105 (2009)., © 2009 American Institute of Physics., published online Apr. 1, 2009., pp. 131105-1 to 131105-3.
S. Fathololoumi et al., Terahertz quantum cascade lasers operating up to ~ 200 K with optimized oscillator strength and improved injection tunneling., Feb. 13, 2012 / vol. 20, No. 4 / Optics Express 3866., © 2012 Optical Society of America., published Feb. 1, 2012., pp. 3866-3876.
Jérôme Faist., Wallplug efficiency of quantum cascade lasers: Critical parameters and fundamental limits., Published Online: Jun. 22, 2007., Appl. Phys. Lett. 90, 253512 (2007)., © 2007 American Institute of Physics., published online Jun. 22, 2007., pp. 253512-1 to 253512-3.
Sushil Kumar et al., Coherence of resonant-tunneling transport in terahertz quantum-cascade lasers., published Dec. 15, 2009., Physical Review B 80, 245316, ©2009 The American Physical Society., pp. 245316-1 to 245316-14.
Chongzhao Wu et al., Large static tuning of narrow-beam terahertz plasmonic lasers operating at 78 K., published online Dec. 19, 2016., APL Photonics 2, 026101 (2016)., © 2016 Author(s)., pp. 026101-1 to 026101-9.

* cited by examiner

TECHNOLOGIES FOR A PHASE-LOCKED TERAHERTZ PLASMONIC LASER ARRAY WITH MICROCAVITIES

CROSS-REFERENCE TO RELATED APPLICATIONS

This application claims the benefit of U.S. Provisional Patent Application No. 63/186,233, filed May 10, 2021, the entire contents of which being hereby incorporated by reference herein, for all purposes.

GOVERNMENT RIGHTS

This invention was made with government support under ECCS1351142 and ECCS1609168 awarded by the U.S. National Science Foundation. The government has certain rights in the invention.

BACKGROUND

A plasmonic laser is a type of laser that confines light at a sub-wavelength scale by storing some of the light energy through electron oscillations in metallic layers, referred to as surface plasmon polaritons ("SPPs"). Plasmonic lasers are lasers that lead to stimulated emission of SPPs.

Quantum cascade lasers ("QCLs") are nanostructured semiconductor lasers that emit in the mid- to far-infrared portion of the electromagnetic spectrum. QCLs relate to the gain medium used. Unlike typical inter-band semiconductor lasers that emit electromagnetic radiation through the recombination of electron—hole pairs across the material band gap, QCLs are unipolar, and laser emission is achieved through the use of inter-sub-band transitions.

SUMMARY

Technologies are disclosed for a plasmonic laser array device. The device may comprise a first microcavity element. The first microcavity may have a first radiating end facet and a second radiating end facet opposite the first radiating end facet in a longitudinal direction of the device. The device may comprise a second microcavity element. The second microcavity may have a third radiating end facet and a fourth radiating end facet opposite the third radiating facet in the longitudinal direction of the device. One or more microcavity elements may be added to the arrangement in a similar manner.

The device may comprise a first microcavity gap. The first microcavity gap may be configured to separate the first microcavity element and the second microcavity element in the longitudinal direction of the device. The device may comprise a bottom (e.g., metal) layer. The bottom layer may be configured to underly the first microcavity element, the second microcavity element, and the first microcavity gap.

The device may comprise an arrangement of the first microcavity element and the second microcavity element on the bottom layer. The arrangement may be configured such that the second radiating end facet is opposite the third radiating end facet across the first microcavity gap. The arrangement may place at least the first microcavity element and the second microcavity element into a phase-locked orientation for a phased-locked operation of the plasmonic laser array device.

BRIEF DESCRIPTION OF DRAWINGS

The elements and other features, advantages and disclosures contained herein, and the manner of attaining them, will become apparent and the present disclosure will be better understood by reference to the following description of various examples of the present disclosure taken in conjunction with the accompanying drawings, wherein.

DETAILED DESCRIPTION

Figure 1:
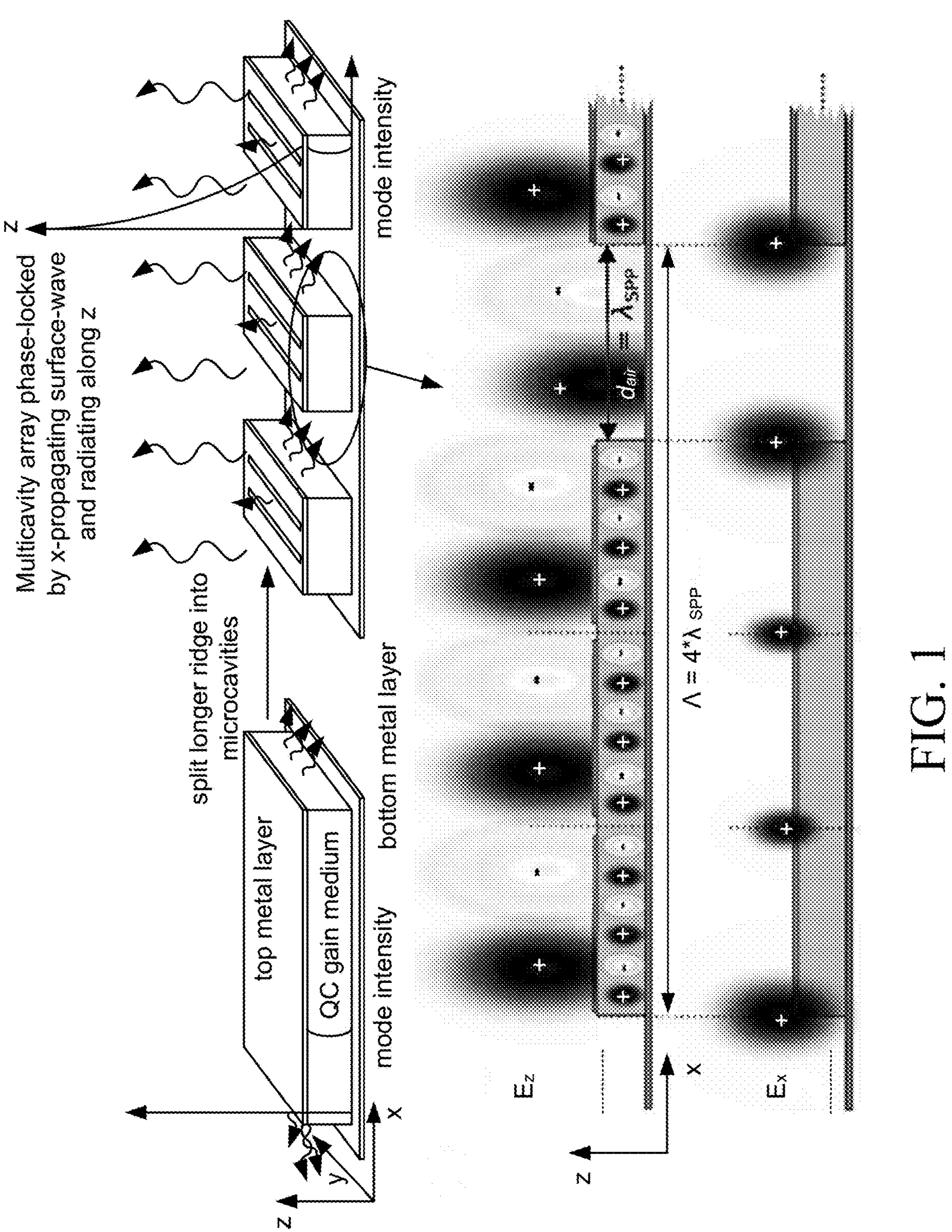
FIG. 1 illustrates an example of longitudinal phase-locking scheme for subwavelength metallic cavities of a laser array designed for surface-emitting configuration.

For the purposes of promoting an understanding of the principles of the present disclosure, reference will now be made to the examples illustrated in the drawings, and specific language will be used to describe the same. It will nevertheless be understood that no limitation of the scope of this disclosure is thereby intended.

Plasmonic lasers suffer from low output power and divergent beams due to their subwavelength metallic cavities. A new phase-locking scheme is developed for such lasers to significantly enhance their radiative efficiency and beam quality. An array of metallic microcavities is longitudinally coupled through traveling plasmon waves, which leads to radiation in a single spectral mode and a diffraction limited single-lobed beam in the surface normal direction. The scheme is implemented for terahertz plasmonic quantum-cascade lasers (QCLs). Peak output power in excess of 2 W is measured for a single-mode 3.3 THz QCL radiating in a narrow single-lobed beam, when operated at 58 K in a compact Stirling cooler. An order of magnitude increase in power and thirty-times higher average intensity is thereby demonstrated for monolithic single-mode terahertz QCLs compared to prior work. The number of photons radiated from the cavity significantly outnumber those absorbed within its claddings and semiconductor medium, which is the first report of >50% radiative efficiency in any single-mode mid-infrared or terahertz QCL.

High-power sources of terahertz radiation are desired for applications in chemical and biomolecular sensing and spectroscopy such as non-destructive evaluation and detection of explosives and drugs, biomedical imaging, and remote-sensing in astronomy to understand star and galaxy formation among many others. Terahertz semiconductor quantum-cascade lasers (QCLs) are closer than ever to target many of such applications with vast scope for commercialization similar to that witnessed by mid-infrared QCLs. Multi-mode terahertz QCLs with Fabry-Perot cavities with output power in the range of hundreds of mill-Watt to multi-Watt have been reported in recent years; however, such lasers show multi-mode spectral output with poor radiation patterns. Stable single-mode operation in a narrow far-field beam is a consistent requirement across many of such applications.

However, progress in improvement of key characteristics of terahertz QCLs has somewhat stagnated in the past decade, in particular with their maximum operating temperature as well as output power. Specifically, the output power of monolithic single-mode terahertz QCLs has not increased much beyond hundred milli-Watt, which was a level reached seven years ago. Some recent results include terahertz QCLs with hybrid second- and fourth-order distributed-feedback (DFB) that achieved 170 mW optical power at 62 K, terahertz QCLs with sampled gratings in the top metal layers with 186 mW output power at 10 K, and terahertz QCLs with quasi-crystalline DFB structure with peak output power of 190 mW at 20 K. The recent development of external-cavity terahertz QCLs is promising as it significantly enhanced the optical power from single-mode terahertz QCLs to the level of a Watt, albeit with the added cost of increased complexity and loss of flexibility and versatility afforded by monolithic chip-based lasers sources.

Phase-locking of an array of optical cavities is a long established method to scale up the outcoupled optical power as well as beam-shaping of conventional semiconductor lasers that continues to be further developed today. It could be all the more relevant for plasmonic lasers that confine long-range surface-plasmon-polariton (SPP) modes at subwavelength dimensions leading to poor radiation patterns and low output power. Terahertz QCLs are also a class of plasmonic lasers that overwhelmingly use parallel-plate metallic cavities, which have excellent mode confinement but poor radiative outcoupling and divergent beams. Different mechanisms for phase-locking of multicavity arrays of metal cavities have been reported for terahertz QCLs toward improvement in their output power, radiative efficiency, and far-field radiation patterns. However, prior phase-locking schemes have not yielded better results for output power when compared to DFB methods.

Described herein are one or more new phase-locking schemes for subwavelength metal cavities in a single-mode terahertz plasmonic QCL to achieve a large radiative efficiency and high-power output in a narrow single-lobed far-field beam. The parallel metallic plates in the cavities sandwich a 10 μm thick quantum-cascade GaAs/AlGaAs superlattice active medium with spectral gain at $\nu$~3.2-3.4 THz ($\lambda$~88-94 μm). Hence, the cavities are subwavelength in the dimension orthogonal to metal plates of the resonant optical cavities, but are kept larger in the other two dimensions. Whereas previously reported phase-locking schemes for semiconductor lasers in the literature primarily relied on lateral coupling of cavities, our method implements a novel longitudinal coupling mechanism by way of single-sided SPP waves that are established on top of metal claddings of the cavities and propagate in the surrounding medium as surface-waves.

The mechanisms of generation of surface-waves and their role in operation of the QCL may differ significantly since they are not the primary contributor to radiation from the phase-locked array. The specific periodicity and dimensions of the short cavities in the multicavity array leads to establishment of an intense in-plane electric-field that radiates and interferes constructively in the surface-normal direction. Based on the scheme, record-highest peak output power (2.03 W), slope-efficiency (1.57 W/A), as well as peak wall-plug efficiency (2.3%) are reported for single-mode terahertz QCLs. A large differential quantum-efficiency of 115 photons per electron is realized for the detected radiation for a fraction of the laser's dynamic range, which is 52% of maximum theoretical limit in the QCL superlattice medium that has 221 repeated stages.

When accounting for optical transmission loss through the cryostat window as well as the laser's internal transition efficiency, the outcoupling (radiative) efficiency of the QCL is estimated to be $\gtrsim$60%, which indicates approximately 50% more photons are radiated from the cavity compared to those absorbed within its claddings and the semiconductor medium. In contrast, the differential quantum-efficiency for all single-mode QCLs in literature including mid-infrared QCLs has remained below 38% of the theoretical limit.

The radiation loss coefficient (in units of per unit length) for a Fabry-Pérot laser cavity is expressed as:

$$\alpha_{rad} = \frac{1}{L}\ln\left(\frac{1}{R}\right) \quad \text{Eq. (1)}$$

where L is the length of the cavity, and R is the reflectivity of each of two end-facets of the cavity for the guided wave propagating along its length. The coefficient for total optical loss in the cavity can be written as $\alpha_{tot}=\alpha_{rad}+\alpha_{cav}$, where $\alpha_{cav}$ is the optical loss coefficient due to cavity itself (e.g., that includes absorption losses in the claddings as well as the gain medium). The radiative (outcoupling) efficiency of the laser can then be defined as the ratio $\eta_{rad}=\alpha_{rad}/\alpha_{tot}$ that determines the radiative fraction of the total number of photons generated in the gain medium of the laser. High-power lasers typically have large dimensions including longer cavities to generate more photons. However, increasing L reduces $\eta_{rad}$ since $\alpha_{rad} \propto 1/L$, which leads to diminishing returns in the net optical power if the cavity is made too long. For monolithic terahertz QCLs, the best radiative efficiencies have therefore been demonstrated in the surface-emitting configuration when $\alpha_{rad}$ is no longer dependent on the cavity dimensions to a first-order, and is instead dependent on design of periodic photonic structures within the cavity and/or its claddings.

At least one useful and/or effective way to increase radiative efficiency for an overall large (long) cavity is by coherently combining radiation from several short-length Fabry-Pérot cavities, each of which have a large $\alpha_{rad}$ as per equation Eq. (1). A large number of such cavities in a multicavity array would then lead to large optical power. FIG. 1 shows a scheme that allows for phase-locked operation for multiple parallel-plate subwavelength metallic cavities when they are placed in a longitudinal arrangement. FIG. 1 describes the scheme qualitatively with at least three elements. The longer cavity on the left is a Fabry-Perot cavity that radiates only from its two end-facets in the longitudinal (x) dimension. However, if shorter cavities are used instead, as shown on right, the effective number of radiating facets are increased. With a specific choice of a certain periodicity in which such short microcavities are placed along x, propagating single-sided hybrid SPPs are sustained outside the cavities (in surrounding medium) if they have a well-defined phase-relation with resonant SPP modes inside the parallel-plate cavities.

These waves are a combination of long-range SPPs as well as short-range quasi-cylindrical waves sustained on top of metal films. Radiative apertures (rectangular slits in FIG. 1) could be opened in the top metal-cladding of the microcavities to serve dual purpose. First, radiation from these apertures serves to intensify the hybrid SPP surface-waves outside the cavities, which is essential for phase-locking to be established. Second, the diffracted field from the apertures could contribute to radiation in surface-normal direction provided the apertures are placed with appropriate periodicity that allows for constructive interference of radiation in the vertical (z) dimension The length of microcavities in the multicavity array is chosen on basis of one or two considerations, for example. First, the length is such that in-plane ($E_x$) electric-field has same phase at the locations of both end-facets where it is most intense. This allows for constructive interference and radiation in surface-normal dimension for the array. Second, the cavities are kept short enough to keep $\alpha_{rad}$ large, with a goal of realizing $\alpha_{rad}$~$\alpha_{cav}$ to achieve an overall large $\eta_{rad}$. For Fabry-Pérot terahertz parallel-plate metallic cavities at 3-4 THz, $\alpha_{rad}$ is in the range 2-3 $cm^{-1}$ for a 1 mm long cavity. The coefficient for total optical loss in the cavity $\alpha_{tot}$ has been experimentally measured in the range ~10-15 $cm^{-1}$ for plasmonic QCLs operating from 3-4 THz based on resonant-phonon QCL active regions, which means that $\alpha_{tot}$ is almost entirely comprised of $\alpha_{cav}$ with a minimal radiative component and $\eta_{rad}$<<1. The cavity lengths in the array were thus chosen to be approximately a third of 1 mm with a goal to realize $\alpha_{rad}$~10 $cm^{-1}$ for the desired lowest-loss resonant optical mode of the phase-locked array.

The specific design of the phase-locked array and its operational principle are shown with an illustrative diagram in FIG. 1. The length of each microcavity is chosen to be ~3$\lambda_{SPP}$, where $\lambda_{SPP}$ is the wavelength of the hybrid SPP surface-wave in surrounding medium that is determined through finite-element (FEM) simulations. For a resonant-mode excited at free-space wavelength $\lambda$, $\lambda_{SPP}\lesssim\lambda$ for the multicavity array surrounded by air or vacuum. Aspp can vary slightly based on the shape of the hybrid SPP mode that differs from one phase-locked resonant mode to another, and hence, is not an implicitly deterministic parameter for a given geometry of the microcavities. For a 3.3 THz laser cavity design, $\lambda$~91 μm, and $\lambda_{SPP}$~81 μm is deduced from experimental data for the measured QCL. For a 3.3 THz ($\lambda$~91 μm) QCL array design, a periodicity $\Lambda$=324 μm (corresponding to $\lambda_{SPP}$~81 μm) is needed based on results from FEM simulations.

As shown subsequently, the experimental lasing frequency of a QCL with this periodicity matches that predicted by results of the FEM simulation. The distance between neighboring cavities $d_{air}$~$\lambda_{SPP}$ ensures the hybrid SPP mode is periodic from one microcavity to another that allows for phase-locking of the hybrid SPP surface-waves to guided SPP modes within the cavities. Slit-like apertures are left open in the top metal cladding at locations where vertical electric-field $E_z$ has a null for standing-wave inside cavities, and hence, the in-plane field $E_x$ has a maxima leading to large diffractive outcoupling from the apertures. The periodicity of aperture locations is kept at ~3$\lambda$/$n_{eff}$ that is approximately an integer multiple of wavelength of guided SPPs within the semiconductor (=$\lambda$/$n_{eff}$) where $n_{eff}$ is effective propagation index of guided SPPs ($\lesssim$3.6 in GaAs). The hybrid SPP mode on top of the metal cladding automatically adjusts its shape to comply with such a periodicity such that $\lambda_{SPP}$~3$\lambda$/$n_{eff}$ for the global phase-locked resonant optical mode in the multicavity array. In that sense, there is no single parameter that exclusively determines the wavelength $\lambda$ of resonant-mode of the multicavity array. Length of individual microcavities, inter-cavity/microcavity gap distance $d_{air}$, or spacing between adjacent apertures could each be changed individually in the array for lithographic tuning of $\lambda$.

Experimental results for tuning of the resonant-frequency of the array by lithographic variation of the $d_{air}$/$\Lambda$ parameter within a range of ~4 μm (as described herein) shows robustness of the design scheme to withstand variations in cavity dimensions that might arise due to fabrication with conventional lithography techniques.

FIG. 1 illustrates an example of a longitudinal phase-locking scheme for subwavelength metallic cavities. The objective of the scheme is to enhance radiation from a long ridge-cavity by splitting it into several shorter microcavities, which increases the number of radiating end facets when the microcavities are under phase-locked operation. A specific periodic arrangement of the microcavities and one or more slit-like apertures in the top metal layer of the cavities establishes single-sided SPPs in the surrounding medium of the cavities, which leads to phase-locked operation of the microcavities. The enhanced radiation in the surface-normal direction is primarily due to a larger number of radiating end-facets for the microcavity array. A secondary contribution of radiation is due to the slit-like apertures within the microcavities.

FIG. 1 also illustrates a specific design of the multicavity QCL array for phase-locked operation. The distance between neighboring microcavities/microcavity elements equal the wavelength of single-sided SPPs ($\lambda_{SPP}$) that are established in the surrounding medium. Each microcavity is of length 3×$\lambda_{SPP}$ and has two slit-like apertures in its top metal layer with an inter-aperture spacing of $\lambda_{SPP}$. An illustration of the standing wave of the electric-field corresponding to the lowest-loss resonant-mode under phase-locked operation is shown for both the vertical ($E_z$) and in-plane ($E_x$) components of the field. The radiating sites in the microcavity array include the end-facets of the microcavities as well as the slit-like apertures, each of which have the same phase for the $E_x$ field, that leads to radiation in the surface-normal direction.

Figure 2:
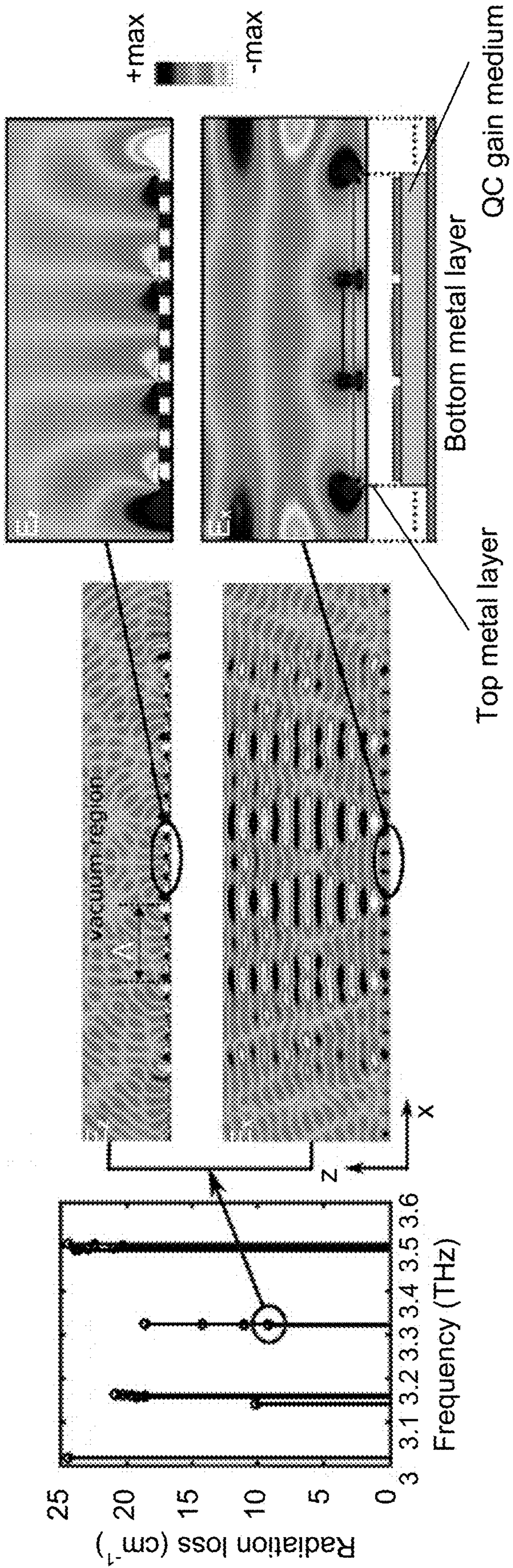
FIG. 2 is an example of a finite-element simulation results for phase-locked microcavity array at terahertz frequencies.

FIG. 2 is an example of a finite-element simulation results for phase-locked microcavity array at terahertz frequencies to assist in understanding operation of the phase-locked array. FIG. 2 shows an eigenmode spectrum of an array that is similar to the one that was experimentally implemented with seven microcavities, computed using an FEM solver. The specific details of the modeling are such that the computed loss is the sum of loss at absorbing boundaries as well as that due to radiation (e.g., outcoupling). By analyzing the eigenfrequencies, their corresponding radiation losses and the electric-field distribution, the lasing frequency as well as the far-field beam patterns can be estimated.

The simulated structure of the phase-locked array has periodicity of $\Lambda$=324 μm for microcavity placement along the longitudinal (x) dimension and an inter-cavity spacing $d_{air}$=$\Lambda$/4. The two-dimensional (2D) simulation effectively solves for cavities of infinite width (along y dimension), which is a good approximation for wide (>>$\lambda$) cavities used in experimental implementation. The occurrence of band-gaps in the resonant-mode spectra is indicative of a distributed-feedback (DFB) effect arising due to the periodicity of the overall array that results in coupling of forward and backward propagating hybrid SPP surface-waves.

In this case, the desired mode (with the desired periodicity of the phase-locked SPP modes as illustrated in FIG. 1) with an intense hybrid SPP mode in the surrounding medium is excited as the lowest-loss mode in the multicavity array. For the shown mode, ~73% of the total electrical energy-density is in confined SPP modes within the microcavities and the remaining fraction exists in hybrid SPPs in the surrounding medium. Like in DFB lasers, the global intensity envelope of the hybrid SPP mode shows maximum intensity at the central microcavity that decays toward either longitudinal ends of the multicavity array along x dimension, which leads to modal discrimination making it the lowest-loss eigenmode.

This is evident from the intensity of the field radiated in surface-normal direction shown in FIG. 2 that is the strongest in the middle of the array. The computed plots of $E_z$ and $E_x$ components of the electric fields are similar to that in the illustrative schematic in FIG. 1. The intense in-plane field $E_x$ (e.g., which leads to radiation from the array) at both end-facets of the microcavities distinctly distinguishes this scheme from surface-emitting DFB terahertz QCLs. A radiative loss of $\alpha_{rad}$~9.5 cm$^{-1}$ is estimated for the lowest-loss mode that is approximately twice that in the DFB QCL structure that led to previous best result for radiative efficiency in terahertz QCLs. The slit-like apertures implemented in the top metal layer also contribute to the overall radiative loss as can be noticed from FIG. 2 due to presence of the in-plane ($E_x$) field in the apertures. By integrating the energy-density due to $E_x$ in a 80 μm×80 μm square region outside the QC gain medium for both the end-facets and apertures of the central microcavity, it is estimated that ~35% of the outcoupled radiation in the phase-locked arrays is from the apertures.

In FIG. 2, the eigenmode spectrum computed by finite-element simulations for the multicavity array in FIG. 1, with GaAs as the active medium ($n_a$=3.6) and air as the surrounding medium ($n_s$=1). Simulations were done in 2D (e.g., cavities of infinite width) for seven 10 μm chick cavities with periodicity Λ=324 μm and inter cavity spacing $d_{air}$=Λ/4. Two equally spaced 9 μm wide apertures are implemented in the top metal cladding for each microcavity. The eigenmode spectrum shows frequencies and radiation loss for the resonant cavity modes of the phase-locked array. The lowest-loss mode occurs at 3.3 THz, and its radiative loss is ~9.5 cm$^{-1}$. The metal layers and the active medium are modeled as lossless to get an accurate estimation of the radiative loss.

FIG. 2 also illustrates an electric field distribution of the resonant mode for both $E_z$ and $E_x$ components (the $E_y$ component is nonexistent for wide cavities). The in-phase $E_x$ field at the locations of the end facets and the apertures leads co highly efficient radiation in the surface normal direction, with a single-lobed beam profile. Insets show the electric field distribution near the central microcavity/microcavity element of the phase-locked array.

An active-medium of the THz-QCLs based on a three-well resonant-phonon design with GaAs/$Al_{0.15}Ga_{0.85}As$ superlattice (design RT3W221YR16A, MBE wafer VB841) is used for experimental implementation of the laser array, with a layer sequence of 57/18.5/31/9/28.5/16.5 (starting from the injector barrier) where the thicknesses are in monolayers (MLs; 1 ML=2.825 Å), and was grown by molecular-beam epitaxy, with 221 cascaded periods, leading to an overall thickness of 10 μm. The design is similar to other QCL designs with minor modifications to achieve peak gain centered around a frequency of 3.3 THz. The QCL superlattice has an average n-doping of 5.7e15 cm$^{-3}$ and surrounded by 0.1 μm and 0.05 μm thick highly-doped GaAs contact layers doped at 5e18 cm$^{-3}$ on either sides of the superlattice. A 200 nm thick $Al_{0.55}Ga_{0.45}As$ layer was grown as an etch-stop layer preceding the entire stack.

The fabrication process described herein. Metallic waveguides were fabricated using standard thermocompression wafer bonding techniques. Following wafer-bonding and substrate removal, positive-resist lithography was used to selectively etch away the 0.1 μm thick highly-doped GaAs layer from almost all locations where top-metal cladding would exist on individual cavities by $H_2SO_4$:$H_2O_2$:$H_2O$ etchant in 1:8:80 concentration. A 10 μm to 15 μm wide highly-doped GaAs layer below the top-metal cladding was left unetched at the regions close to lateral facets of each microcavity and both longitudinal and lateral facets of the bonding pads, serving as the longitudinal and lateral absorbing boundary to ensure the excitation of the desired mode as the lowest-loss lasing mode.

A sequence of Ti/Cu/Au were deposited as top (20/200/100 nm) metallic layers, in which an image-reversal lithography was implemented to form metallic gratings. Phase-lock array cavities then were processed by inductively coupled plasma (ICP) dry etching using $BCl_3$, $Cl_2$ and Ar etchant in 20 sccm, 5 sccm and 5 sccm (cubic centimeters per minute at STP) with $SiO_2$ as mask. The substrate was then mechanically polished down to a thickness of 300 μm to improve heat-sinking. A Ti/Cu/Au (20/250/100 nm) contact was also used as the backside-metal contact for the finally fabricated QCL chips to assist in soldering.

Figure 3A:
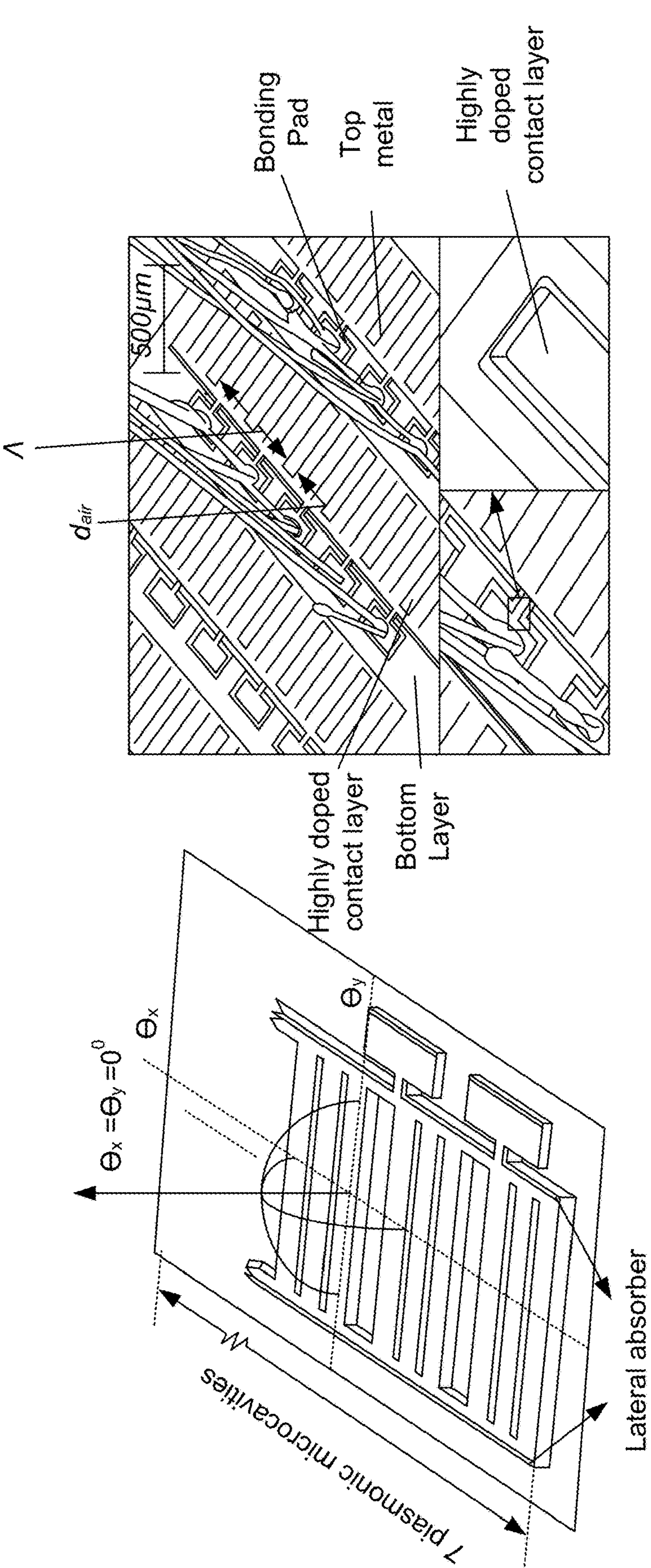
FIG. 3A and FIG. 3B illustrate example experimental results from a representative QCL implemented with the phase-locking scheme in pulsed mode of operation for emission in a surface-normal direction.
Figure 3B:
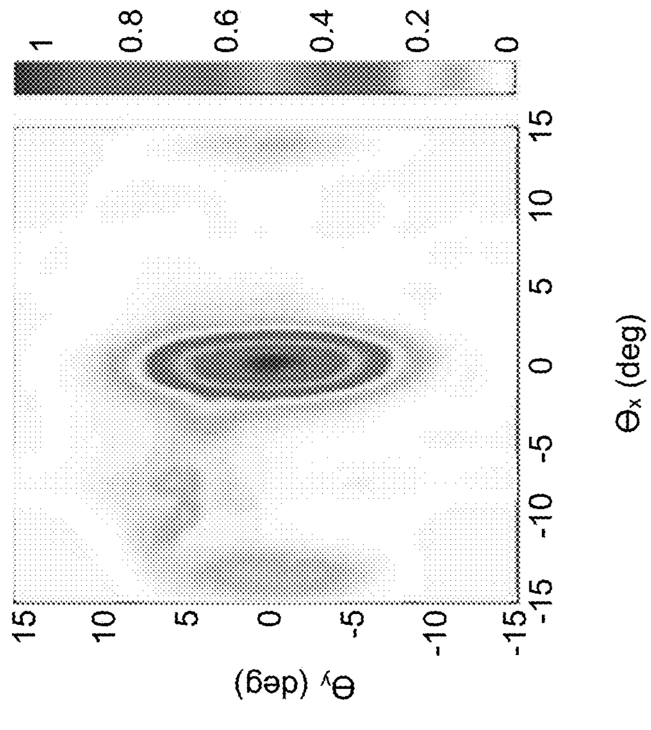
Figure 3B:
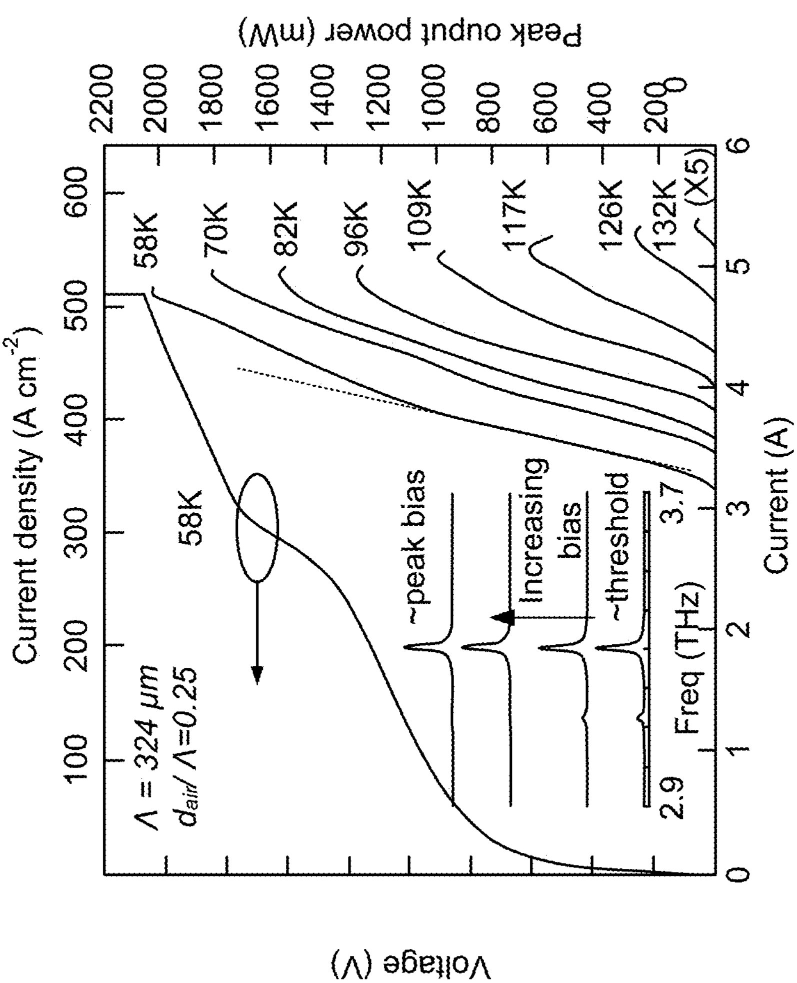

Experimental results from a representative terahertz QCL implemented with the phase-locking scheme in pulsed mode of operation are shown in FIG. 3A and FIG. 3B. Microcavities are combined on both lateral sides so they could be electrically biased simultaneously with few bonding pads. There is no optical coupling in those narrow connection regions. A scanning-electron-microscope (SEM) image of the fabricated and mounted QCL chip in FIG. 3A shows several QCLs of varying dimensions located side by side. FIG. 3B shows light-current (L-I) curves versus heat-sink temperature for the best performing QCL in terms of peak output power. A current-voltage (I-V) curve measured at 58 K is also shown. The results presented here are from a QCL of overall dimensions 10 μm×500 μm×2.2 mm consisting of seven microcavities. The QCL emits in single-mode at ~3.3 THz at most bias conditions (except close to threshold when it also excites a second weaker spectral mode). The spectra as a function of bias are plotted in the inset of the figure. This QCL operated up to maximum temperature of 132 K whereas the best Fabry-Pérot QCLs fabricated from the same wafer operated up to 159 K. For the light-current-voltage measurements, a pulse of 400 ns duration with 10 kHz signal cycle and an electric gate of 1000 Hz square wave with 50% duty cycle was chosen to drive the devices presented herein in a Stirling-cooler operating at ~58 K (the overall bias duty-cycle is 0.2%).

Under the similar condition but without 1000 Hz electric gate (0.4% duty-cycle), the absolute power was calibrated using a thermopile power meter (Scientech AC2500 with AC25H) as is reported without any corrections nor focusing optics were used in this process. Peak optical power of 2030±10 mW was detected for the QCL at 58 K, which evaluates to a peak wall-plug efficiency of 2.3% for corresponding bias conditions. A slope-efficiency (SE) of 1566±10 mW/A is estimated from the slope of approximately the first-half dynamic range at 58 K in which the L-I is linear. To understand the significance of this result, a discussion about SE of a QCL may be useful. The SE of a QCL is expressed as:

$$\frac{dP_{out}}{dI} = \frac{\hbar\omega}{q} N_p \eta_i \eta_{rad} \qquad \text{Eq. (2)}$$

In Eq. 2, Pout is the output power, I is the bias current, –hω is the photon energy, q is the fundamental electronic charge, Np is the number of repeat stages in the QCL, $\eta_i$ is the internal quantum-efficiency of the QCL superlattice that is affected by the injection efficiency as well as the radiative transition efficiency in the QCL superlattice, and $\eta_{rad}=\alpha_{rad}/(\alpha_{rad}+\alpha_{cav})$ is the aforementioned radiative efficiency of the cavity. The slope of the L-I reduces at higher bias currents, which is likely due to a reduction in $\eta_i$ as the electron-gas becomes hotter in the quantum-wells of the superlattice, which reduces the lifetime of the upper radiative sub-band due to thermally activated phonon scattering.

For the QCL in FIG. 3B, a maximum value of $\eta_i\eta_{rad}$~0.52 is estimated for the detected power. In comparison, many previously published single-mode terahertz or mid-infrared QCLs have remained below 0.32 and 0.38 respectively for the value $\eta_i\eta_{rad}$. When correcting for 92-94% transmission through a 0.47 mm thick TPX (polymethylpentene) window of the cryostat, $\eta_i\eta_{rad}\gtrsim0.55$ is estimated. A conservative estimate of $\eta_i$~0.92 is obtained for the QCL band structure by assuming a unity injection efficiency, and using only longitudinal optical LO-phonon scattering with a somewhat arbitrary electron temperature of 100 K for upper laser sub band and an effective tunneling time for the lower laser sub band to compute the radiative transition efficiency.

Hence, a conservative estimate of $\eta_{rad}$~0.60 is obtained for the shown terahertz QCL. This result demonstrates that the radiative outcoupling from the cavity as characterized by $\alpha_{rad}$ exceeds the optical loss coefficient in the cavity $\alpha_{cav}$ by about 50%. In the fabricated QCL, the $\alpha_{rad}$ could easily be different from that predicted in FEM simulations by several $cm^{-1}$, especially since it depends sensitively on width of apertures and overall extent of the metal claddings on top the QCL cavities. An exact estimate of absolute value of $\alpha_{rad}$ may be relatively difficult to obtain for the fabricated QCLs.

The power output of this device was also measured with a much larger duty cycle of 4% (a pulse of 400 ns duration with 100 kHz signal cycle). Peak output power of 1990 mW was detected at 58 K, which is slightly lower than the power measurement with 0.4% duty cycle and is may be due to a stronger electrothermal effect for a higher duty cycle and/or power dissipation in the microcavity array.

Experimental far-field beam pattern for the phased-locked array QCL is shown in FIG. 3B. Diffraction-limited single-lobed far-field beams were measured in both lateral (x) and vertical (y) dimensions. Far-field beam patterns were measured with a pyroelectric detector mounted on a 2D motorized scanning stage, which was placed at 45 cm from the phase-lock array, with maximum scan angle ±26.5° in both two directions. The devices were operated near the peak power operated at 10 kHz with a 300 ns pulse duration and electronically modulated with pulse-trains at 1000 Hz (0.15% duty-cycle).

Figures 4A, 4B:
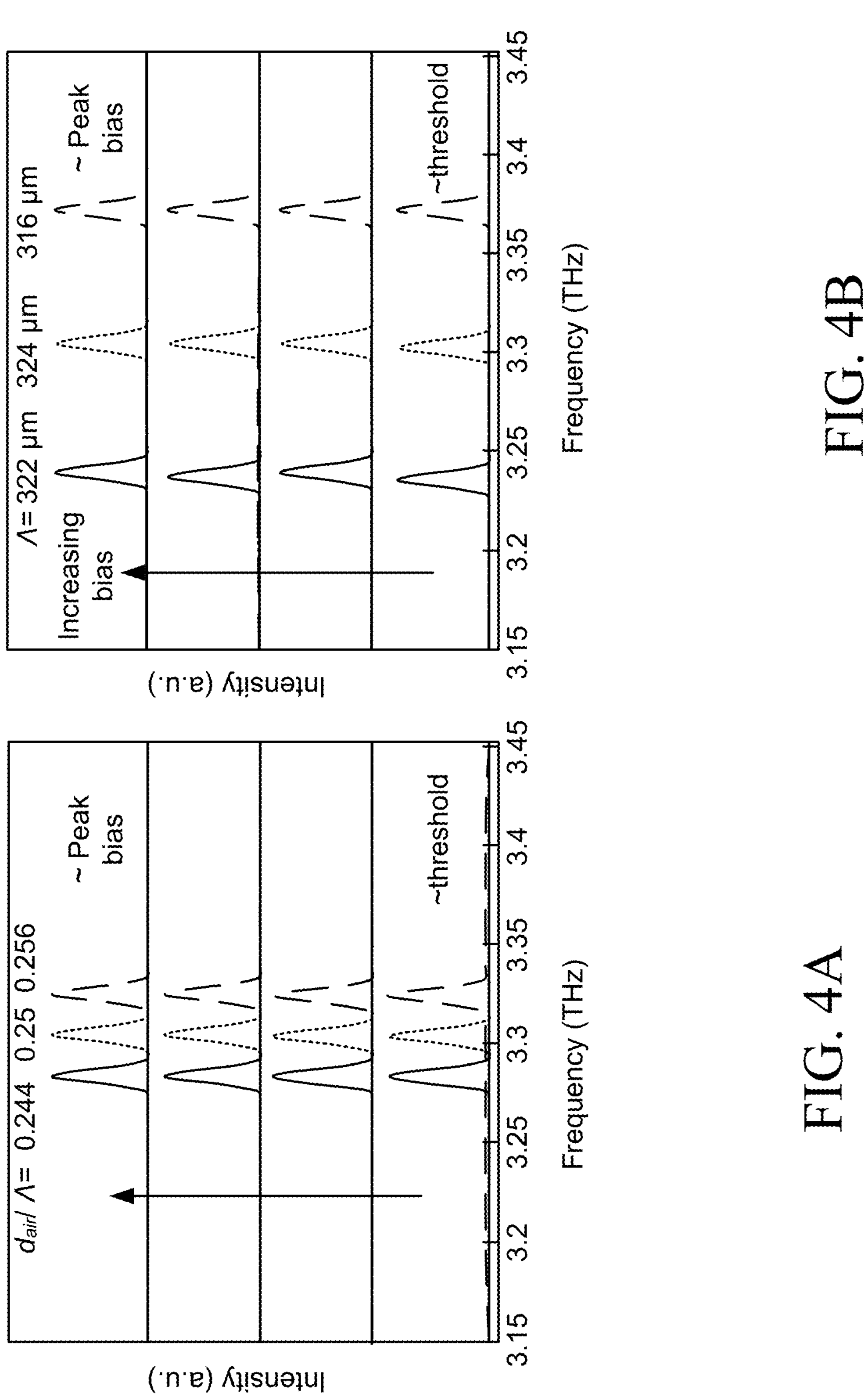
FIG. 4A and FIG. 4B illustrate example lithographic tuning of the phase-locked terahertz QCL arrays.

The full-width half-maximum (FWHM) for the QCL presented in FIG. 3B is ~3.2°×11.5°, which is narrower in x dimension due to a large width of cavity ~0.5 mm in the dimension. The robustness of the phase-locking scheme and the ability for lithographic tuning was verified by slightly changing the duty-cycle $d_{air}/\Lambda$ and keeping $\Lambda$ as a constant for different QCLs fabricated on the same semiconductor chip. Spectra from multiple such QCLs using a Fourier-transform infrared-spectrometer (BRUKER; VERTEX 70v) are shown in FIG. 4A. All of the QCLs show single-mode operation in the entire dynamic range and the lasing frequencies scale linearly with the duty-cycle. As discussed earlier, lithographic tuning could also be realized by changing other design parameters. This was verified by changing the periodicity $\Lambda$ while keeping the duty-cycle $d_{air}/\Lambda$ constant. The spectra for multiple such QCLs are shown in FIG. 4B, when, yet again robust single-mode operation was realized in the entire dynamic range of the QCLs, and the emission frequencies scale linearly with $\Lambda$.

FIG. 3A and FIG. 3B illustrates experimental results for a surface-emitting terahertz QCL. FIG. 3A illustrates a schematic of the phase-locked QCL array as it was implemented for final fabrication. The microcavities are connected through both lateral sides by narrow metallic strips, which create absorbing regions chat selectively make higher-order lateral modes in the cavities more lossy. FIG. 3A also shows a scanning electron microscope image of the fabricated QCL arrays. The insets show the ~15 μm wide lateral absorbing regions composed of an exposed chin highly doped GaAs contact layer.

FIG. 3B illustrates example experimental lasing characteristics (L-I and I-V) of a representative phased-locked array QCL with seven microcavities, each with the dimensions 10 μm×243 μm×500 μm, at different heat sink temperatures. The inset shows QCL spectra at varying electrical bias at 58 K. FIG. 3B also illustrates a far-field radiation pattern of the QCL measured close to its peak operating bias. The single-lobed beam has a FWHM of 3.2°×11.5°.

FIG. 4A and FIG. 4B illustrate example lithographic tuning of the phase-locked QCL arrays. FIG. 4A illustrates example measured spectra from three different phase-locked QCLs with the same periodicity of the microcavities ($\Lambda$=324 μm) but slightly different $d_{air}/\Lambda$ values, where $d_{air}$ is the intercavity/microcavity gap spacing. All the QCLs consist of seven microcavities and are biased similarly at an operating temperature of 58 K.

FIG. 4B illustrates example measured spectra from three different phase-locked QCLs with different periodicity of the micro-cavities but a fixed $d_{air}/\Lambda$=0.25. The QCLs are located adjacent to each other on the fabricated wafer. All QCLs show robust single-mode operation from threshold to high peak bias.

As described herein, a phase-locking scheme for metallic subwavelength cavities in a plasmonic laser may achieve large radiative efficiency and output power. When implemented for terahertz plasmonic QCLs, record-highest peak output power is reported for single-mode terahertz QCLs, and record highest radiative efficiency is estimated among many/all single-mode QCLs (including mid-infrared QCLs) as published to-date. The method leads to stable single-mode spectral operation and a diffraction-limited single-lobed far-field beam for the laser. There are at least two unique aspects to the scheme. First, it leads to longitudinal phase-locking of a multicavity array, which differs distinctly from other phase-locking schemes for semiconductor lasers in literature that predominantly rely on lateral coupling of multiple cavities. Second, it generates coherent single-sided SPPs propagating as surface-waves in surrounding medium of the metal cavities with large vertical spatial extent, which could lead to development of new modalities for spectroscopic sensing and wavelength tunability due to access of a coherent SPP wave on top of the plasmonic laser's cavity.

Peak output power of 2.03 W is detected for a surface-emitting 3.3 THz QCL operating at 58 K in pulsed mode of operation. The QCL radiates in a single-lobed far-field beam with FWHM divergence of 3.2°×11.5°. Owing to high power and narrow beam, the average intensity within the FWHM contour at a fixed distance for this QCL is ~40 times the previous best achieved for a DFB terahertz QCL, and ~30 times that estimated for a phased-locked array terahertz QCL. A slope-efficiency of up to 1.57 W/A was measured that corresponds to a differential quantum-efficiency of 115 photons reaching the detector per electron transported through the QCL superlattice, which is 52% of the maximum theoretical limit for the QCL.

The radiative efficiency, which is the fraction of total generated photons that are radiated to free-space, is expected to be even higher ($\gtrsim$60%). This result makes it the first single-mode QCL (including mid-infrared QCLs) in which more photons are radiated than those absorbed as optical losses within the cavity. Finally, robust single-mode operation and lithographic tuning across a bandwidth of ~140 GHz is demonstrated for a range of QCLs fabricated on the same semiconductor chip. The advantage of the scheme lies in ease of implementation that does not require tight tolerances for fabrication, as well as the possibility to further scale optical power output by increasing lateral size of the cavities as well as number of elements in the multicavity array.

Figure 5:
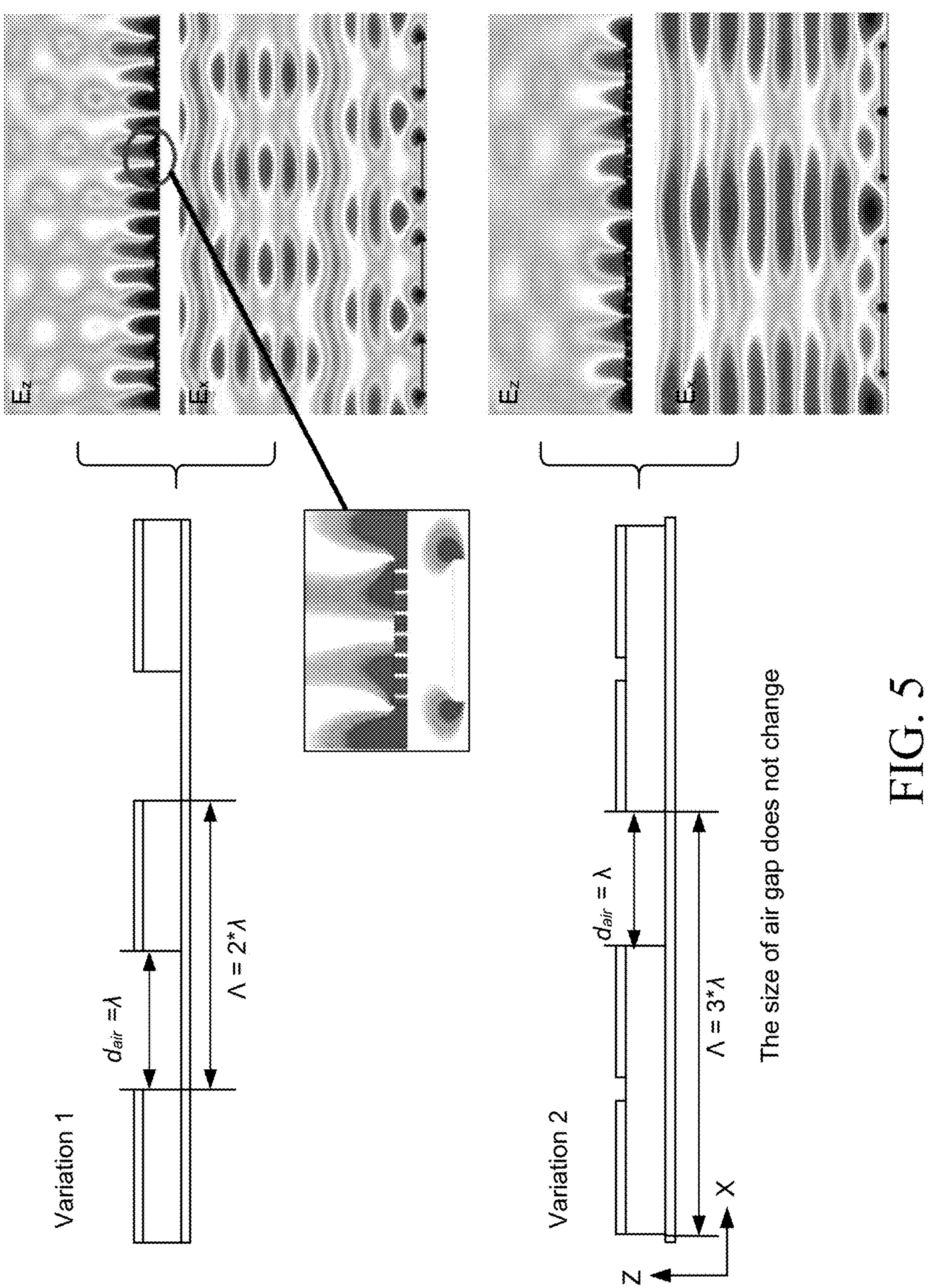
FIG. 5 illustrates at least two different examples of the phase-locked microcavity array for a surface-emitting configuration.

FIG. 5 illustrates at least two different examples of the phase-locked microcavity array. The phase-lock scheme for air-guided THz plasmonic modes in surface-emitting configuration concept can be modulated and modified to provide much stronger radiation loss, which is very promising to further enhance the power output level of single mode terahertz QCLs. The radiation loss of the some of the current designs described herein is close to ~10/cm. In order to further improve the radiation loss to higher level, the laser cavity can be made shorter, so that the mirror loss could be much more enhanced. In FIG. 5, some variations of the original phase-lock scheme for air-guided THz plasmonic modes in surface-emitting configuration are illustrated In FIG. 5, variations and modifications of phase-lock schemes for air-guided THz plasmonic modes in surface-emitting configuration are shown. The design principle of the modification on the original phase-lock scheme for air-guided THz plasmonic modes in surface-emitting configuration is that the length of each individual micro-cavity should be multiple times of the wavelength of terahertz SPP wave propagating in the free space attached to top metal layer, and the distance between neighboring cavities may equal one wavelength of the SPP wave. These specific arrangements would allow the index perturbation happen every several wavelength in the air region and guarantee the surface-emitting configuration. FIG. 5 shows two particular designs with various length of microcavities. The radiation loss of them are typically as high as 12/cm and 15/cm respectively. The power output of both variations would be even much larger than the other phase-lock schemes for air-guided THz plasmonic modes in surface-emitting configuration. An example of such design may include one or more microcavities that are integer multiples of the wavelength of the SPP wave, whereas the distance between the microcavities may (e.g., always) kept equal to one wavelength of the SPP wave.

There are also some other modifications for the other phase-lock schemes for air-guided THz plasmonic modes in surface-emitting configuration. In at least one phase-locking scheme, index perturbation happens every multiple wavelength for the terahertz wave propagating inside & outside the active medium. So that the facets and apertures implemented lithographically could interfere constructively in the far field region to form single-lobe far field beam pattern. In some cases, edge-emitting lasers but not surface-emitting lasers that may have some specific application like self-mixing so that two end-facets emission is highly desired.

The subject matter of this disclosure, and components thereof, can be realized by instructions that upon execution cause one or more processing devices to carry out the processes and/or functions described herein. Such instructions can, for example, comprise interpreted instructions, such as script instructions, e.g., JavaScript or ECMAScript instructions, or executable code, and/or other instructions stored in a computer readable medium.

Implementations of the subject matter and/or the functional operations described in this specification and/or the accompanying figures can be provided in digital electronic circuitry, in computer software, firmware, and/or hardware, including the structures disclosed in this specification and their structural equivalents, and/or in combinations of one or more of them. The subject matter described in this specification can be implemented as one or more computer program products, e.g., one or more modules of computer program instructions encoded on a tangible program carrier for execution by, and/or to control the operation of, data processing apparatus.

A computer program (also known as a program, software, software application, script, or code) can be written in any form of programming language, including compiled or interpreted languages, and/or declarative or procedural languages. It can be deployed in any form, including as a stand-alone program or as a module, component, subroutine, and/or other unit suitable for use in a computing environment. A computer program may or might not correspond to a file in a file system. A program can be stored in a portion of a file that holds other programs and/or data (e.g., one or more scripts stored in a markup language document), in a single file dedicated to the program in question, and/or in multiple coordinated files (e.g., files that store one or more modules, sub programs, or portions of code). A computer program can be deployed to be executed on one computer or on multiple computers that may be located at one site or distributed across multiple sites and/or interconnected by a communication network.

The processes and/or logic flows described in this specification and/or in the accompanying figures may be performed by one or more programmable processors executing one or more computer programs to perform functions by operating on input data and/or generating output, thereby tying the process to a particular machine (e.g., a machine programmed to perform the processes described herein). The processes and/or logic flows can also be performed by, and apparatus can also be implemented as, special purpose logic circuitry, e.g., an FPGA (field programmable gate array) and/or an ASIC (application specific integrated circuit).

Computer readable media suitable for storing computer program instructions and/or data may include all forms of non-volatile memory, media and memory devices, including by way of example semiconductor memory devices (e.g., EPROM, EEPROM, and/or flash memory devices); magnetic disks (e.g., internal hard disks or removable disks); magneto optical disks; and/or CD ROM and DVD ROM disks. The processor and/or the memory can be supplemented by, or incorporated in, special purpose logic circuitry.

While this specification and the accompanying figures contain many specific implementation details, these should not be construed as limitations on the scope of any invention and/or of what may be claimed, but rather as descriptions of features that may be specific to described example implementations. Certain features that are described in this specification in the context of separate implementations can also be implemented in combination in perhaps one implementation. Various features that are described in the context of perhaps one implementation can also be implemented in multiple combinations separately or in any suitable sub-combination. Although features may be described above as acting in certain combinations and/or perhaps even (e.g., initially) claimed as such, one or more features from a claimed combination can in some cases be excised from the combination. The claimed combination may be directed to a sub-combination and/or variation of a sub-combination.

While operations may be depicted in the drawings in an order, this should not be understood as requiring that such operations be performed in the particular order shown and/or in sequential order, and/or that all illustrated operations be performed, to achieve useful outcomes. The described program components and/or systems can generally be integrated together in a single software product and/or packaged into multiple software products.

Examples of the subject matter described in this specification have been described. The actions recited in the claims can be performed in a different order and still achieve useful outcomes, unless expressly noted otherwise. For example, the processes depicted in the accompanying figures do not require the particular order shown, and/or sequential order, to achieve useful outcomes. Multi-tasking and parallel processing may be advantageous in one or more scenarios.

While the present disclosure has been illustrated and described in detail in the drawings and foregoing description, the same is to be considered as illustrative and not restrictive in character, it being understood that only certain examples have been shown and described, and that all changes and modifications that come within the spirit of the present disclosure are desired to be protected.

What is claimed is:

1. A plasmonic laser array device, comprising:

a first microcavity element, the first microcavity having a first radiating end facet and a second radiating end facet opposite the first radiating end facet in a longitudinal direction of the device;

a second microcavity element, the second microcavity having a third radiating end facet and a fourth radiating end facet opposite the third radiating facet in the longitudinal direction of the device;

a first microcavity gap configured to separate the first microcavity element and the second microcavity element in the longitudinal direction of the device, a distance between the first microcavity element and the second microcavity element being configured as an integer multiple of a surface plasmon polariton (SPP) wavelength;

a bottom layer configured to underly the first microcavity element, the second microcavity element, and the first microcavity gap; and an arrangement of the first microcavity element and the second microcavity element on the bottom layer, the arrangement configured such that the second radiating end facet is opposite the third radiating end facet across the first microcavity gap, the arrangement placing at least the first microcavity element and the second microcavity element into a phase-locked orientation for a phased-locked operation of the plasmonic laser array device.

2. The device of claim 1, wherein the device further comprises:

a third microcavity element, the third microcavity having a fifth radiating end facet and a sixth radiating end facet opposite the third radiating end facet in the longitudinal direction of the device; and a second microcavity gap configured to separate the second microcavity element and the third microcavity element in the longitudinal direction of the device, the bottom layer being further configured to underly the second microcavity gap and the third microcavity.

3. The device of claim 2, wherein the arrangement is further configured such that the fourth radiating end facet is opposite the fifth radiating end facet across the second microcavity gap, the arrangement placing the first microcavity element, the second microcavity element, and the third microcavity element into the phase-locked orientation for the phased- locked operation of the plasmonic laser.

4. The device of claim 2, wherein at least one of: the first microcavity element, the second microcavity element, or the third microcavity element is a subwavelength metal cavity.

5. The device of claim 3, wherein the first microcavity element has a first top surface opposite the bottom layer, the first top surface having a span from the first radiating end facet to the second radiating end facet.

6. The device of claim 5, wherein the first top surface comprises at least a first aperture, the at least first aperture configured to emit at least some level of radiation from an interior of the first microcavity element through the at least first aperture.

7. The device of claim 6, wherein the first top surface comprises at least another aperture in addition to the first aperture, the other aperture configured to emit at least some level of radiation from an interior of the first microcavity element through the other aperture.

8. The device of claim 6, wherein the second microcavity element has a second top surface opposite the bottom layer, the second top surface having a span from the third radiating end facet to the fourth radiating end facet, wherein the second top surface comprises at least a second aperture, the at least second aperture configured to emit at least some level of radiation from an interior of the second microcavity element through the at least second aperture.

9. The device of claim 8, wherein the third microcavity element has a third top surface opposite the bottom layer, the third top surface having a span from the fifth radiating end facet to the sixth radiating end facet, wherein the third top surface comprises at least a third aperture, the at least third aperture configured to emit at least some level of radiation from an interior of the third microcavity element through the at least third aperture.

10. The device of claim 9, wherein at least one of: the first aperture, the second aperture, or the third aperture is a slit-type opening.

11. The device of claim 3, wherein the arrangement is further configured such that the first microcavity element, the first microcavity gap, the second microcavity element, the second microcavity gap, and the third microcavity element are disposed on the bottom layer with a predetermined periodicity.

12. The device of claim 11, wherein the predetermined periodicity is based, at least in part, on a predetermined wavelength of at least one single-sided surface plasmon polariton (SPP) to be generated in a surrounding medium of the first microcavity element, the first microcavity gap, the second microcavity element, the second microcavity gap, and the third microcavity element.

13. The device of claim 12, wherein a production of the at least one single-sided SPP places the first microcavity element, the second microcavity element, and the third microcavity element into the phased-locked operation of the plasmonic laser.

14. The device of claim 12, wherein a length of the first microcavity gap in a longitudinal direction of the plasmonic laser array device is substantially equal to the wavelength of at least one single-sided SPP.

15. The device of claim 12, wherein the predetermined periodicity is a function of the wavelength of at least one single-sided SPP.

16. The device of claim 9, wherein at least one of: the first radiating end facet, the second radiating end facet, the third radiating end facet, the fourth radiating end facet, the fifth radiating end facet, or the sixth radiating end facet, contributes to a radiation emission on a surface normal direction relative to the first microcavity element, second microcavity element, and the third microcavity element.

17. The device of claim 16, wherein at least one of: the first aperture, the second aperture, or the third aperture, further contributes to the radiation emission on the surface normal direction relative to the first microcavity element, second microcavity element, and the third microcavity element.

18. The device of claim 1, wherein a length of the first microcavity element is determined, at least in part, such that an in-plane electric field emanating from the first microcavity element has a same phase at the first radiating end facet and at the second radiating end facet.

19. The device of claim 1, wherein the plasmonic laser array device is at least a part of a terahertz plasmonic quantum-cascade (QCL) laser.

20. The device of claim 1, wherein the longitudinal direction of the device extends in the direction across the first microcavity element, the second microcavity element, and the third microcavity element, the phase-locked operation of the plasmonic laser array having a longitudinal orientation.

* * * * *